United States Patent
Chechendaev et al.

(10) Patent No.: US 10,634,737 B2
(45) Date of Patent: Apr. 28, 2020

(54) DEVICE FOR DETERMINING LOCATION IN SPACE RELATIVE TO A SIMILAR DEVICE

(71) Applicant: Aleksej Vladimirovich Chechendaev, Moscow (RU)

(72) Inventors: Aleksej Vladimirovich Chechendaev, Moscow (RU); Ivan Nikolaevich Manilenko, Vladimir (RU); Vladimir Anatol'evich Chechendaev, Vladimir (RU)

(73) Assignee: Aleksej Vladimirovich Chechendaev, Moscow (RU)

( * ) Notice: Subject to any disclaimer, the term of this patent is extended or adjusted under 35 U.S.C. 154(b) by 0 days.

(21) Appl. No.: 16/357,174

(22) Filed: Mar. 18, 2019

(65) Prior Publication Data

US 2019/0293730 A1    Sep. 26, 2019

(30) Foreign Application Priority Data

Mar. 21, 2018    (RU) .............................. 2018109964

(51) Int. Cl.
  *G01R 33/022*    (2006.01)
  *G01S 11/02*    (2010.01)
  *H04B 5/00*    (2006.01)
(52) U.S. Cl.
  CPC ............ *G01R 33/022* (2013.01); *G01S 11/02* (2013.01); *H04B 5/0087* (2013.01)
(58) Field of Classification Search
  None
  See application file for complete search history.

(56) References Cited

U.S. PATENT DOCUMENTS

| | | | |
|---|---|---|---|
| 8,018,382 B2 | 9/2011 | Shore et al. | |
| 2006/0132352 A1* | 6/2006 | Schantz | G01C 21/206 |
| | | | 342/125 |
| 2008/0036652 A1* | 2/2008 | Shore | E21B 47/02224 |
| | | | 342/357.31 |

(Continued)

FOREIGN PATENT DOCUMENTS

| | | |
|---|---|---|
| RU | 2131132 C1 | 5/1999 |
| WO | 2013018038 A1 | 2/2013 |
| WO | 2017180503 A1 | 10/2017 |

OTHER PUBLICATIONS

Search Report in RU 2018109964/28 (015443), dated Sep. 14, 2018.

*Primary Examiner* — Nasima Monsur
(74) *Attorney, Agent, or Firm* — Bardmesseer Law Group

(57) ABSTRACT

Device for determining position in space relative to a similar device includes a movable enclosure on which two loop antennas are mounted, besides, the device includes, for each antenna, an EMF sensor of induced EMF when an RF signal is emitted by the similar device is emitted, and a processor that calculates amplitudes and orientations of magnetic field generated by antennas of the similar device, wherein direction vector is based on directions and orientations of magnetic field strengths. An RF signal generator generates an RF signal of a predetermined frequency and amplitude for the antennas, where the EMF sensors operate alternately with the RF signal generator; and a unit for determining the direction to the similar device based on a gradient of magnetic field emitted by the antennas of the similar device.

18 Claims, 4 Drawing Sheets

(56) References Cited

U.S. PATENT DOCUMENTS

| | | | |
|---|---|---|---|
| 2010/0066371 A1* | 3/2010 | Vij | A61B 5/055 |
| | | | 324/318 |
| 2010/0262002 A1* | 10/2010 | Martz | A61M 5/14566 |
| | | | 600/432 |
| 2014/0030955 A1 | 1/2014 | Smetanin et al. | |
| 2015/0196229 A1* | 7/2015 | Old | G06F 19/00 |
| | | | 600/302 |
| 2017/0085127 A1* | 3/2017 | Leabman | H02J 7/00 |
| 2017/0123426 A1* | 5/2017 | Hill | G05D 1/028 |

\* cited by examiner

DEVICE FOR DETERMINING LOCATION IN SPACE RELATIVE TO A SIMILAR DEVICE

CROSS REFERENCE TO RELATED APPLICATIONS

This application claims priority to RU 2018109964, filed on Mar. 21, 2018, which is incorporated herein by reference in its entirety.

BACKGROUND OF THE INVENTION

Field of the Invention

The proposed device is a tool for determining the relative location of objects in space and can be used in the design of toys, determining the relative location of aircraft and direction of their travel, including drones, as well as in space systems.

The proposed device is intended to determine the distance, direction and orientation of two devices, each of which is equipped with such a system. Each of the proposed devices has a pocket-size design, it can be placed, e.g., in a housing as small as a tennis ball, with low consumed and radiated power. Also, each device is relatively simple, which means low production costs.

Description of the Related Art

Known systems built on satellite navigation systems do not always ensure the necessary measurement accuracy, are quite expensive, have a high energy consumption, require a lot of time to prepare for the first launch, and do not always function indoors where the signal is blocked.

Known navigation systems made on the basis of wireless information networks and other systems using stationary signal sources and receivers, as shown in U.S. Pat. Nos. 6,059,718, 6,400,139 and 9,459,124, require a special external infrastructure, and suffer from increased power consumption, given the need for data transmission and processing power.

Conventional devices do not provide direction finding or azimuth detection or pitch for devices at rest.

A technical solution closest to the proposed one is the device described in Russian Federation Patent No. 2475290. This known device includes a housing, a movable part related to the housing, computing aids and a device controlled by the computing aids that creates the effect as perceived by the user. The movable part accommodates at least one inductance coil fixed inside. At least one inductance coil is also mounted in the housing, and the device has a tool to measure mutual inductance between the coils connected to the computing aids which are designed to determine the mutual arrangement of the said coils by the mutual inductance values obtained from the specified measurement tool, and is associated with the device intended for the creation of user-perceived effects based on data about the relative arrangement of inductance coils.

The device ensures direction finding, however this effect is achieved by limiting device spatial movements.

SUMMARY OF THE INVENTION

The technical result achieved in the proposed device is to overcome shortcomings in the conventional art by creation of a versatile device for determining the relative mutual location in space with similar devices that does not require any infrastructure, is ready to operate immediately after activation and provides high measurement accuracy.

In one aspect, there is provided a device for determining position in space relative to a similar device, including a movable enclosure; two loop antennas on the enclosure; for each loop antenna, at least one EMF sensor that detects EMF induced in a corresponding antenna when a radio-frequency (RF) signal of at least one of the antennas of the similar device is emitted; and a processor configured to calculate amplitudes and orientations of magnetic fields generated by the radio-frequency signal of antennas of the similar device, based on data from the EMF sensors, and to calculate a distance to a similar device and orientation of a direction axis on which the direction vector of a similar device lies based on the directions and orientations of magnetic field strengths; a radio-frequency signal generator generating the radio-frequency signal of a predetermined frequency and amplitude for transmission of an RF signal to the loop antennas, such that the EMF sensors operate alternately with the RF signal generator; and a unit for determining the direction to the similar device based on a gradient of magnetic field emitted by the loop antennas of the similar device.

Optionally, the RF signal is fed alternately to the antennas in specified time intervals, and wherein the unit for determining the direction to the similar device uses a difference of the EMF excited in the EMF sensors by radiating antennas of the similar device. Optionally, the device includes a third loop antenna whose plane is located at angles to planes of the two loop antennas and intersects with a plane-plane intersection line of the two loop antennas. Optionally, the movable enclosure includes first and second enclosures that are movable over the base plane, and the two loop antennas are mounted in the movable enclosure so that when the first and second enclosures are mounted on the base plane, the loop antenna planes are located at angles to the base plane so as to intersect with the plane-plane intersection lines of the loop antenna of the respective devices. Optionally, the device is configured to transmit the RF signal generated by the RF signal generator to the antennas of the device at a predetermined intervals. Optionally, each of the loop antennas is a double loop antenna with two EMF sensors, and the unit for determining the direction to the similar device determines the direction based on a comparison of EMFs generated in the same double loop antenna. Optionally, the unit for determining the direction to the similar device determines the direction where the EMF is larger in a part of the double loop antenna that is closer to the similar device, when the difference between the induced EMFs exceed a predetermined threshold. Optionally, the computing device calculates the orientation of the similar device in relation to the device following determination of the orientation of a direction axis and distance to the similar device and a determination of amplitudes and orientations of strengths of the magnetic field generated by antennas of the similar device. Optionally, the device includes a displacement sensor, and the unit for determining the direction to the similar device determines the direction to the similar device, with a moving device body, when the EMF induced in the loop antenna increases and a distance to the similar device is reduced, and vice versa. Optionally, the displacement sensor is an inertial navigation system. Optionally, the displacement sensor is an odometer. Optionally, intervals between rotational changes are specified according to a maximum possible rotational speed of the device and a maximum possible rotational speed of a similar device so that a maximum angle between direction axes of two successive measurements does not exceed 90°. Optionally, when the device stops, a constant EMF signal generated in the loop antennas of the device by a similar device is received, and then when the device moves, a change of the EMF generated in the loop antenna is detected, and the direction to the similar device is determined. Optionally, the device receives a signal corresponding to a speed of the similar device from the second device, and the unit for determining the direction to the similar device determines the direction to the similar device when the similar device is moving uniformly or stops. Optionally, a separate remote unit calculates the orientation of the direction vector to the similar device, the remote unit includes a processor that is the same type of processor as the processor of the device, and wherein the remote unit receives motion parameters of the device and of the similar device and selects most likely motion directions of the device and the similar device from four alternatives:
  (i) the device moving towards the similar device, the similar device moving away from the device;
  (ii) the device moves towards the similar device, the similar device moves towards the device;
  (iii) the device moves away from the similar device, the similar device moves away from the device; and
  (iv) the device moves away from the similar device, the similar device moves towards the device.

Optionally, the separate remote unit is a processor of a mobile phone. Optionally, the mobile phone shows a dynamic schematic display of motion parameters of the device and of the similar device. Optionally, the separate remote unit calculates the device's direction vectors to several similar devices.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF EMBODIMENTS OF THE INVENTION

Figure 1:
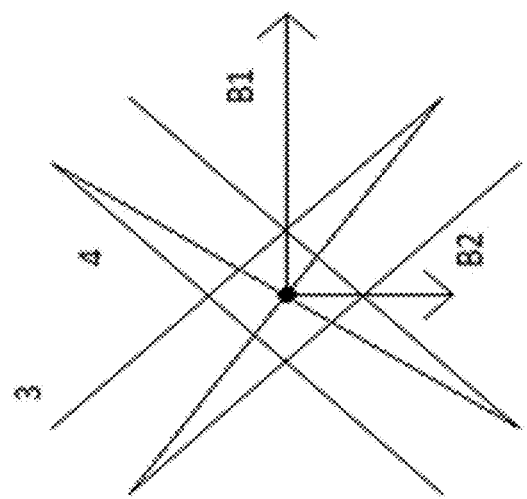
FIG. 1 shows a schematic representation of coils' (antennas) interaction.
Figure 1:
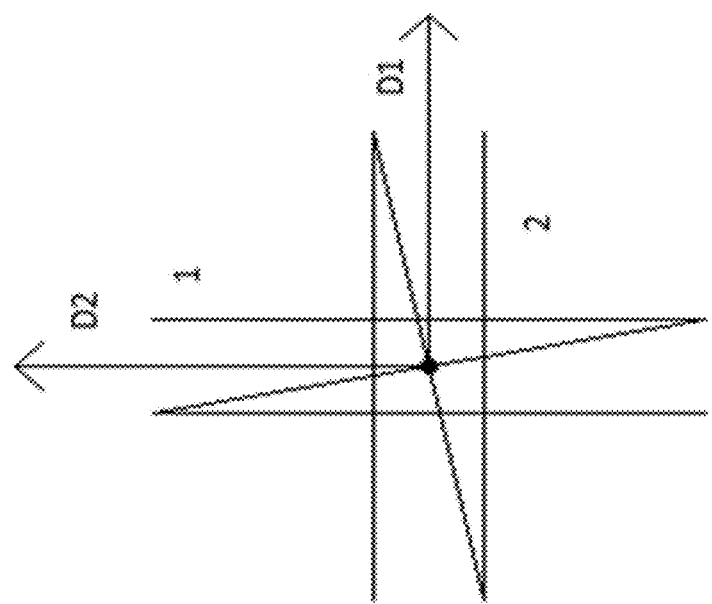

Reference will now be made in detail to the embodiments of the present invention, examples of which are illustrated in the accompanying drawings.

The technical result is achieved by the fact that the device used for determining the location of a device in space relative to a similar device includes a movable housing whereon two loop antennas are installed. The device includes, for each antenna, at least one EMF (electromotive force) sensor guided in the relevant antenna when the RF signal is emitted by at least one of the antennas of the similar device, and a computing device configured to calculate amplitudes and magnetic field intensity orientations generated by the radiation of the similar device's antennas based on signals coming from the EMF sensors during emission, and to calculate the distance to a similar device and orientation of the direction axis on which the direction vector to a similar device lies in accordance with magnetic field intensity directions and orientations. In this context, the device also includes a RF signal generator designed to generate a RF signal with a voltage of a predetermined frequency and amplitude and with the possibility of regular transmission of the RF signal to the device antennas, while creating an operational procedure in which EMF sensors operate in turns with the RF signal generator and not simultaneously with it, and the unit that determines the direction to a similar device is designed to ensure identification of the direction by an alternating magnetic field emitted by antennas of a similar device.

A particular case of the invention embodiment involves transmission of an RF signal in sequence to the antennas in preset time intervals, and the unit which determines direction to a similar device is designed with an additional feature that enables to determine the orientation of a similar device with respect to the device, based on the difference of electromotive forces excited in sensors by various antennas of a similar device. The device may also contain a third loop antenna with a plane located at an angle to the planes of the first two loop antennas and intersecting with the plane-plane intersection line of the first two loop antennas.

The first and second housings may be designed with a feature that enables moving over the ground plane, and loop antennas are installed inside the housing in such a way that with housings installed on the ground plane, the planes of loop antennas are located at angles to the ground plane which intersects with the plane-plane intersection lines of respective devices' loop antennas. The device itself may be designed with a feature that enables transmission of an RF signal, generated by an RF signal generator, in a predetermined sequence to the device antennas with a preset interval between the moments of transmission of the RF signal to the device antennas. Each of the loop antennas may be designed as a double loop antenna, each part of which is a simple loop antenna. Moreover, the device includes EMF sensors in each part of the loop antennas, and the unit for determining the direction of vector to a similar device is made as one which determines the vector direction based on comparison of EM forces generated in parts of one and the same double loop antenna by radiation from antennas of a similar device.

In order to measure the relative coordinates of the transmitter, the mutual induction principle is used in the receiving device, as shown in FIG. 1. A voltage with variable frequency is applied to the transmitter coil, and excited voltage is measured in the coils of the receiving device. The receiving device determines the location of the transmitter and transmitter orientation in the coordinate system linked to the receiving device.

Currently, the system is implemented to determine the coordinates and direction on the plane. Both devices move in this case over a flat surface, e.g. a floor. In this case, it would be sufficient to have two transmitting coils and two receiving coils installed on devices. If the coils are arranged orthogonally, many calculations will be greatly simplified.

Each device includes four loop antennas, two transmitting and two receiving coils (antennas) constructed as conductors on printed circuit boards. Since the emitting and receiving coils of the same device are preferably not used at the same time, each device may contain one pair of versatile coils for each direction. Another particular case of implementation involves transmitting and receiving coils that differ by the number of turns to be matched with the device electronic circuits.

The first transmitting coil emits an electromagnetic field in a certain period of time, where it is possible to measure the signals using two receiving coils. During another period of time, the next coil emits an electromagnetic field, and two signals from the receiving coils are measured on the receiving device. Thus, the measurement results are formed as a 2×2 matrix, where the columns mark the number of the receiving coil, and the rows—the measurement numbers or the numbers of transmitting coils. The matrix as a three-dimensional version will be a 3×3 matrix.

The parameters as follows can be determined based on these matrices:
  direction to the receiver in the coordinate system of the transmitting device with an uncertainty of ±180°;
  direction of the transmitting device in the coordinate system of the receiver with an uncertainty of ±180°;
  distance between coil centers;

If no additional technical solutions are applied, there is an uncertainty of 180° in determining the devices' orientation. If, for example, the calculation shows an angle of 45°, the real value could be 45° or 45°+180°=225°. In the event of direction to the receiving device in the coordinate system of the transmitting device, this uncertainty means that we do not know whether the transmitting device is pointed towards the receiving device with its front or rear. In the event of direction of the transmitting device in the coordinate system of the receiving device, this uncertainty means that we do not know whether the transmitting device is located in the front or rear hemisphere of the receiving device.

If more complexity is added to the design, the uncertainty may be resolved, for example, by using the device movement and by comparing the signal levels in different positions. The signal increases when moving forward provided that the transmitter is located in the front hemisphere. In order to use this option, one needs to wait for the transmitting device to stop and identify this fact using the positioning method disclosed in this application.

Another way to resolve the uncertainty of direction to another device is to use receiving antennas consisting of two identical parts, and measure the EMF in two parts with a conclusion that the device is on the side where the part with the greater EMF is located.

An additional way to eliminate the uncertainty uses communication between the devices. If, for example, a position-determining device is standing and a similar device is moving backwards, and the distance to it increases, the similar device will be pointed towards the position-determining device with its front part.

Due to the low frequency of transmitted and received signals (approx. 400 kHz), the data rate implemented in the device using discrete components is 64 bps. This rate is sufficient for sending data regarding transmitting device motion direction and solve the issue of orientation uncertainty.

Furthermore, the computing device may include a separate remote unit to calculate the orientation of the direction vector to a similar device, which can be a versatile computing unit that is common both to the device and a similar device. At this point, the separate remote unit can receive motion parameters of the device and a similar device and select the most probable motion directions of the device and a similar device from four alternative options according to the motion parameters of devices and a similar device, where the following devices are regarded as alternative options:
  the device moves towards a similar device, the similar device moves away from the device;
  the device moves towards a similar device, the similar device moves towards the device;
  the device moves away from a similar device, the similar device moves away from the device;
  the device moves away from a similar device, the similar device moves towards the device.

A separate remote unit can be a computing device/processor of the user's mobile phone, which can provide a dynamic and schematical display of motion parameters of the device and of the similar device. A separate remote unit can calculate vectors of the device's direction to several similar devices.

Once the uncertainty of two direction options is resolved, one can track the position of a similar device. In order to do this, an interval defined between measurements is small so that none of the devices during the time gap between measurements could turn more than by 90°. This allows to ascertain that the true direction in a new measurement is that one which is closer to the direction in the previous measurement.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

FIG. 1 shows schematically the coils 1 and 2 of the transmitting device and vectors of their dipoles D1 and D2, respectively, as well as coils 3 and 4 of the receiving device and the magnetic field vectors B1 and B2, respectively, generated by the coils 1 and 2.

Figure 2:
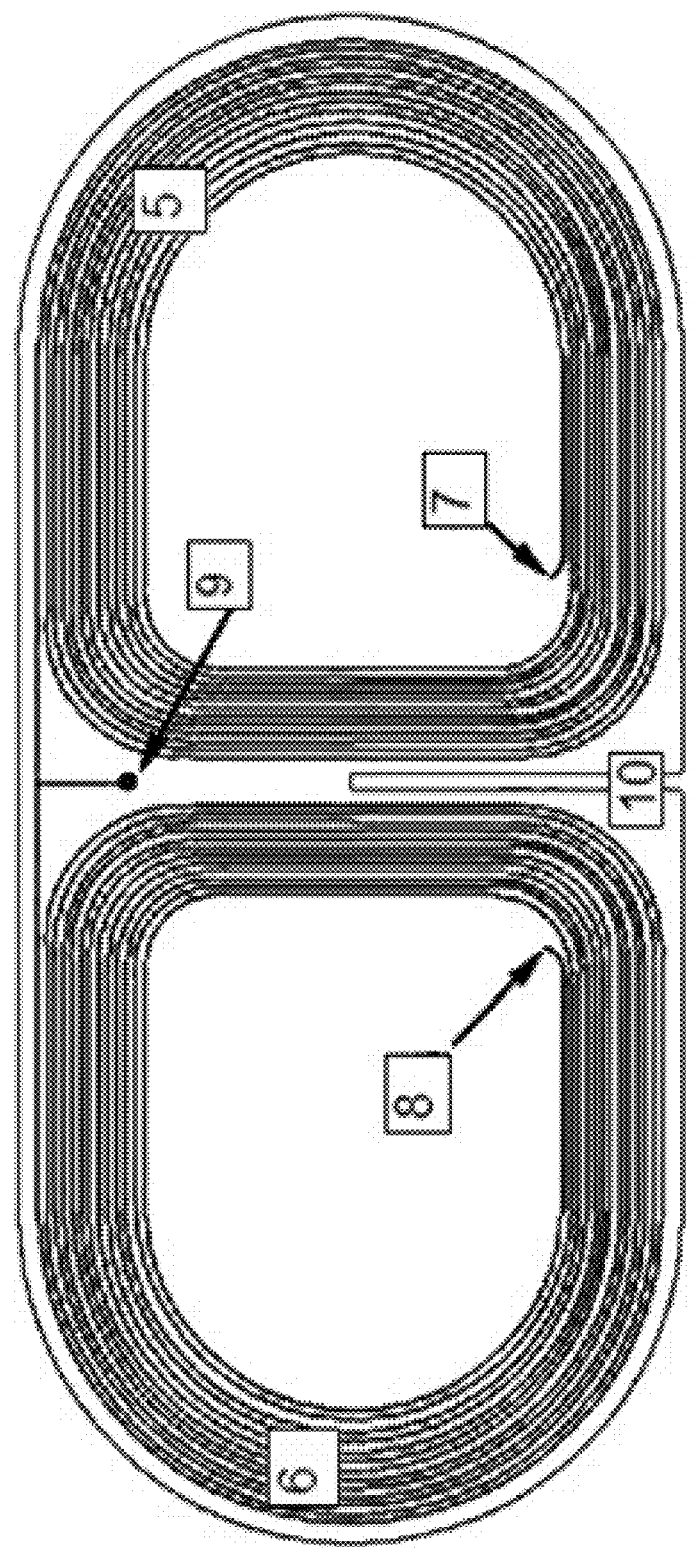
FIG. 2 shows a loop antenna in one of the examples of invention embodiment.

FIG. 2 shows a loop antenna of one of the invention embodiments, made of two adjacent loop antennas 5 and 6, connected in series, with the possibility of measuring the EMF both in any component of the antenna and in the entire antenna. Three terminals are used for measurements, two of which (7 and 8) are located on the free coil ends, and the third one (9) is at the coils connection point. The printed circuit board accommodates slot 10 for mechanical connection of orthogonal antennas.

The electromotive force measured at the end pins of the coils 7 and 8 connected in series is approximately equal to the electromotive force of one coil covering the same area. The end pins are used to measure the position of other devices in the range from −90° to 90°.

Auxiliary pin 9 at the coils connection point is used to resolve the 180°-uncertainty, so if another device is located to the left of the antenna, the signal induced on the left coil side is greater than the right side signal induced at the same coil.

Such an approach is not applicable if the antenna plane is orthogonal to the direction towards the other device. In this case, a similar composite coil, orthogonal to the above one, may resolve this uncertainty since the direction towards the second device is in the plane of the specified coil.

Figure 3:
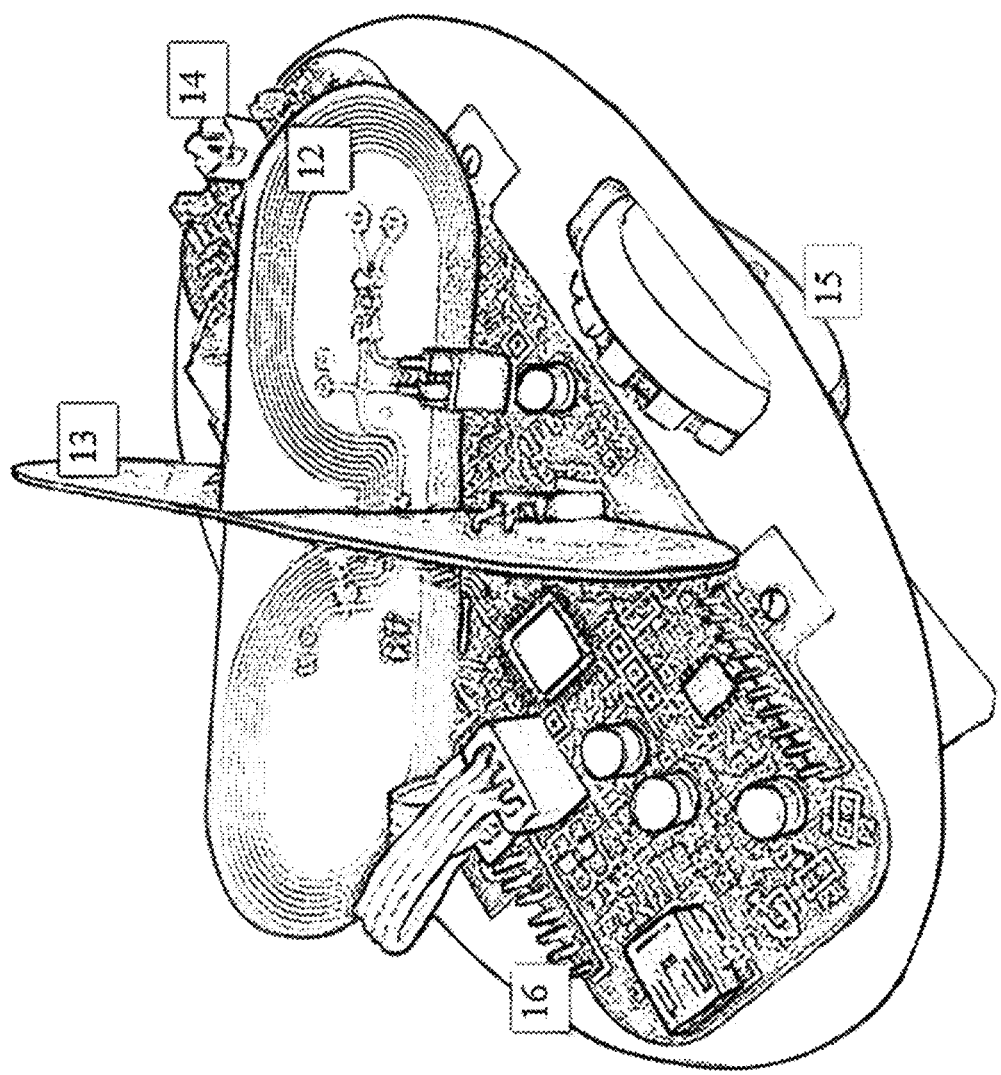
FIG. 3 shows an example of executed moving structure using the proposed device.

FIG. 3 shows an example of a moving structure using the proposed device that includes a processor 11, power control units controlled by the processor, receiving and transmitting antennas 12 and 13, motors driving wheels 15 and control circuits and, in a particular case of the embodiment, an infrared proximity sensor 14 located in the front part to prevent collisions. The device is designed to be powered by 4 AAA batteries, with a total nominal voltage of 6 V, and a linear voltage converter is used to provide stable power to electronic components. The device uses the NXP ARM CortexM3 processor, but can use any other processor with sufficient processing power.

The device includes a 16 CPU UART interface available on a special connector. It is used to connect a Bluetooth-module to the PC.

In a preferred embodiment, both devices are trolleys that can move on a horizontal surface (floor). And the useful effect of the invention is the information on board each trolley about the position of another similar trolley. Each trolley includes four loop antennas, two transmitting and two receiving antennas implemented as conductors on printed-circuit boards.

In a preferred embodiment, two printed-circuit boards of the same dimensions are used to construct the antennas, they are located orthogonal to the floor and to each other; the printed-circuit boards intersect in the middle and contain transmitting coils or antennas on one side, and receiving coils or antennas on the other side. Each printed-circuit board includes one transmitting and one receiving antenna, and the shape of antennas is symmetrical to the vertical axis, as shown in FIG. 2. Such symmetry significantly simplifies calculations. The transmitting antennas are supplied with alternating voltage in a preset sequence, its frequency can be adjusted from 130 kHz to 1 MHz, and this frequency is selected from considerations of the electromagnetic compatibility and regulatory requirements. In a preferred embodiment, the signal is first fed to one transmitting antenna for 12 ms, then the 12 ms signal is transmitted to the other antenna and this is repeated every 100 ms. This allows to determine the position of each trolley 10 times per second, taking less than 25% of the airtime; the latter allows the simultaneous operation of up to four similar devices based on time-division of the channels, and in this case each of the devices receives information about the other three. In a preferred embodiment, two EMF sensors are in operation at all times when there is no transmission and each measures the signal amplitude from the corresponding coil.

Since the receiving coils are arranged orthogonally and the EMF is proportional to the variable magnetic field inside the coil, simultaneous EMF measurement, as shown in FIG. 1, provides the measurement of B1 and B2 vectors. When coil 1 emits, both receiving coils measure the B1 vector, but when coil 2 emits, both receiving coils measure the B2 vector. However, since the electromagnetic field is variable, it is possible to determine the straight line on which vector B lies and its length, but it is impossible to determine the direction of the vector in this straight line. Therefore, the vector direction is taken randomly by either of the two, and the possibility that it is actually the opposite one is taken into account when evaluating the calculation results.

In order to calculate the relative position of the devices based on measurement results, a modified dipole approximation is used, where each emitting coil is considered as a rough magnetic dipole and the field generated by this coil is described by the formula as follows:

$$B = K(|r|)\left(\frac{3r(D*r)}{r^5} - \frac{D}{r^3}\right) \quad (1)$$

Where B is magnetic field, r is distance to the center of the emitting coil and D is dipole vector with unit length, and K is a geometric parameter.

This formula differs from the classical formula known from electrodynamics by the presence of the term K(|r|), which is set from a table and is determined experimentally for the chosen coil geometry. This increases the accuracy at distances comparable to the coil dimensions, since dipole approximation is formally applicable only at distances much larger than the coil dimensions. In FIG. 1, the vectors of dipoles corresponding to the coils are indicated by D1 and D2.

In the case of a variable magnetic field, the formula (1) is applicable to the amplitudes of the variable signal, in this case the |D| value, with a given coil geometry and known amplitude of the current circulating in it is also known.

Since a similar device generating a variable magnetic field has in its preferred embodiment two orthogonal coils switched on alternately, as a result of EMF measurement in both receiving coils when each of the two transmitting coils is switched on, the vectors B1 and B2 corresponding to the emission of the coils described by the dipoles D1 and D2 are measured, i.e., it is possible to write a system of two equations (2).

$$B1 = K(|r|)\left(\frac{3r(D1*r)}{r^5} - \frac{D1}{r^3}\right)$$

$$B2 = K(|r|)\left(\frac{3r(D2*r)}{r^5} - \frac{D2}{r^3}\right)$$

$$D2 = D1*M90$$

$$|D1| = |D2| = 1,$$

where M90 is a matrix of a rotation by 90°.

This system is solved numerically in a preferred embodiment, and the following items are calculated: R vector and orientation of D1, D2 vectors relative to R. −R vector is the position of coils' intersection similar to the devices in the coordinate system of the measuring device, and the orientation of D1, D2 vectors gives information about the rotation of a similar device. There are always two solutions for this system, if R, D1, D2 are the solution, then so are −R, −D1, −D2 as well. Moreover, since the direction of B1 and B2 can actually be the opposite to that chosen randomly after measurements, the following solutions are possible: R, D1, D2; R, −D1, −D2; −R, −D1, −D2; −R, D1, D2.

In a preferred embodiment, each of the receiving loop antennas is divided into two parts, so that each part is a loop antenna and it is possible to measure the EMF in one part simultaneously with the measurement of the EMF in the whole antenna, and the EMF in the other part is calculated by subtraction. One such part lies on one side from the vertical line of coils intersection, and the other on the other side, so the parts are symmetrical relative to this line. The unit for determining the direction to a similar device assumes that the EMF value is larger in that part of the loop antenna which is closer to the similar device. The closer the angle between that two-component coil and the 90° direction of the device, the worse this principle works, because in the extreme case, at an angle of 90°, both coils are at the same distance and it is impossible to determine the direction. Therefore, of the two orthogonal printed-circuit boards, containing receiving antennas, only that antenna is used the angle of which is lower compared to the direction towards the device and the coils from this board are used to determine the direction. Thus, coils with an angle of 45° or less towards the similar device are always used.

Figure 4:
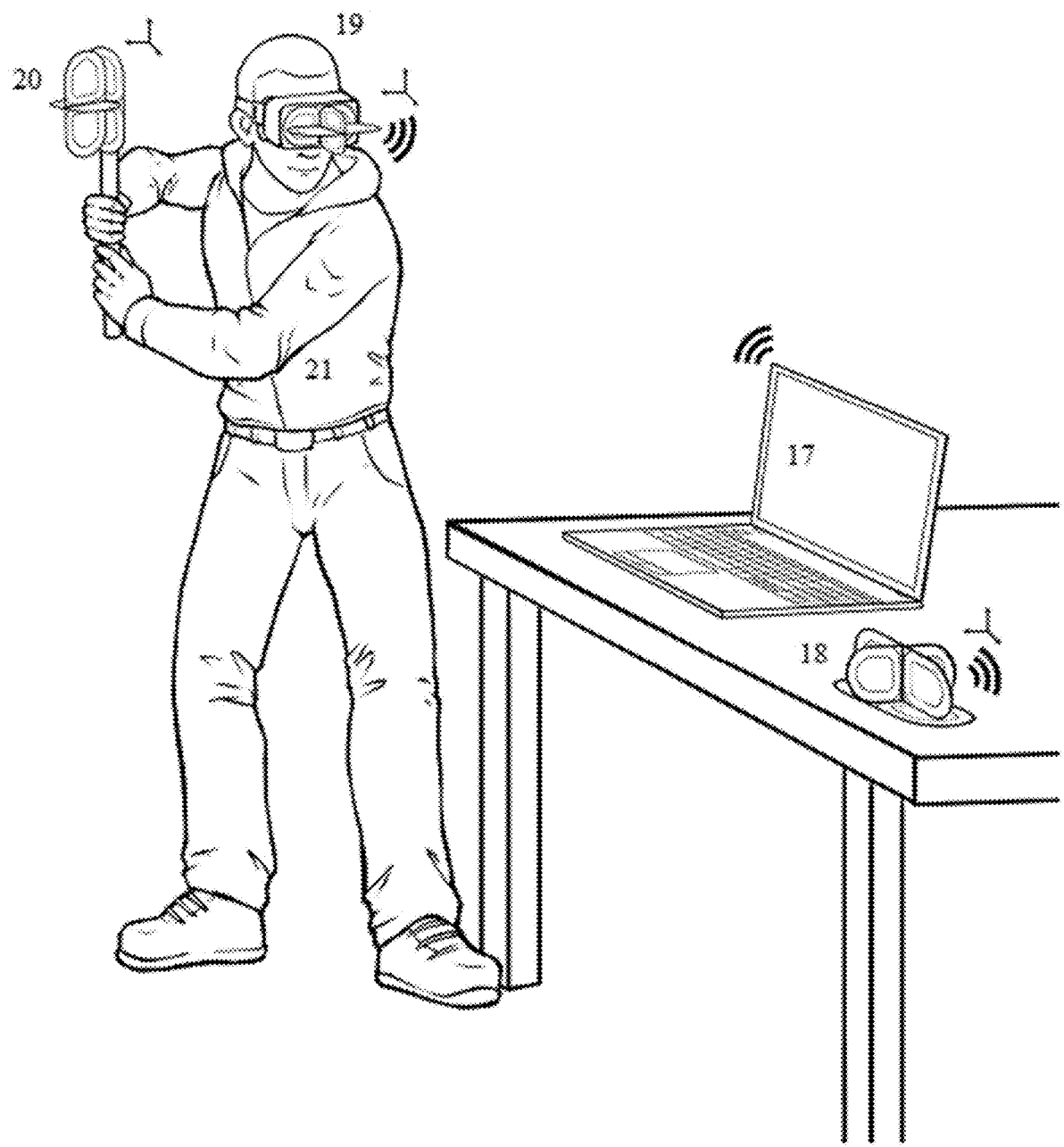
FIG. 4 shows another alternative example of the use of invention

In another embodiment shown in FIG. 4, a system that uses devices includes three proposed devices with three antennas and a central processing unit, made, for example, as a computer 17. In this embodiment example, each device includes three printed circuit boards each containing two coils, one of which can be used to generate variable magnetic field, the other to measure it by measuring the EMF generated in that coil.

As shown in FIG. 4, the system includes a first stopping accuracy device 18, stationary in space, a second device 19 attached to the virtual reality headset, and a third device 20, the position of which is selected by the user 21. The third device is used e.g. to form an image of a virtual weapon, such as a laser sword, the stopping accuracy device is used to determine the displacement of the second and third devices in space, and the second device is used to form a virtual or augmented reality, such as a medieval landscape on whose background the user uses a virtual sword. The system may contain several second and third devices when used by multiple users at the same time. The computing system in the form of, e.g., a personal computer can be used both to calculate the positions of devices in space and to form a virtual or augmented reality image.

Each of the three devices includes an acceleration sensor and an electronic unit that converts the sensor output signals into a digital form and performs digital signal processing and transmission of the outputs over a wireless channel to a central computer. Coils generating the variable electromagnetic field are switched on alternately. After one device alternately turns on its all three coils, after a short pause, the other device starts turning on its coils and so the switching on of all nine coils of the three devices is repeated periodically. All three coils measuring the variable magnetic field and belonging to the same device are arranged orthogonally to each other, so that their centers coincide.

The electronic unit of each device simultaneously measures the EMFs induced in the receiving coils by the variable magnetic field. In order to calculate the mutual orientation of the two devices based on nine measured EMF values, a system of three equations is solved, which differs from (2) by the presence of a third equation for the third coil; this system of vector equations uses three-dimensional vectors, unlike the system (2).

Similar to the preferred example of embodiment, the system of equations has also four solutions in this example of embodiment. Hereby, there are two possible variants of the vector connecting the devices equal on the module and opposite on a direction, and besides there are also two variants of the solution equal on the module and opposite on a direction for a vector defining orientation of the similar device. Until one of the four solutions corresponding to the actual location of the devices in space is identified, these solutions are treated as hypotheses. To determine the true direction of these four hypotheses, an alternative example of embodiment uses the joint processing of data coming from all sensors on the central computer, using data from acceleration sensors. For each hypothesis, based on the mutual orientation of the devices, a second derivative of the distance between the sensors is calculated. The second derivative is calculated in two ways, (1) by differentiating the distance between the devices obtained by the above method and (2) based on the readings of acceleration sensors. In the correct hypothesis, the two calculated acceleration differences will always coincide with the accuracy of the measurement and calculation error, and in the case of false hypotheses, in general, they will not coincide. This allows developing an algorithm that excludes incorrect hypotheses from consideration and, as a useful effect of using the invention, to form information about the relative position and orientation of each pair of devices. Based on the determination of three mutual positions in the three possible pairs of devices, the relative position of the three devices is calculated, and the redundancy of information (the third pair of devices) is used to suppress noise when using Kalman filtering.

In another alternative embodiment, the device can be designed as receiving a signal from the second device, corresponding to the motion direction of a similar device (forward/backward/stop), and in the case of its motion, as a device determining which of its two possible orientations corresponds to a real one. And if the second device stops when the first one keep moving, a true hypotheses out of the two hypotheses about the position of the second device will be specified.

Having thus described a preferred embodiment, it should be apparent to those skilled in the art that certain advantages of the described method and apparatus have been achieved.

It should also be appreciated that various modifications, adaptations, and alternative embodiments thereof may be made within the scope and spirit of the present invention. The invention is further defined by the following claims.

What is claimed is:

1. A system for determining position and orientation in space of a first device relative to a second device, comprising:
   each of the first and second device including a movable enclosure;
   the first device including two loop antennas on its movable enclosure, the two loop antennas oriented non-parallel relative to each other;
   the second device including two loop antennas on its movable enclosure, the two loop antennas oriented non-parallel relative to each other;
   the two loop antennas of the first device including a first loop antenna and a second loop antenna, and a first and second EMF sensors correspondingly coupled to the first and second loop antennas, wherein the first and second EMF sensors detect a radio frequency (RF) signal emitted by the two loop antennas of the second device; and
   a processor configured to calculate amplitudes and orientations of magnetic fields generated by the RF signal of the loop antennas of the second device, based on data from the EMF sensors, and to calculate a distance to the second device and a direction axis on which the second device lies based on the amplitudes and orientations of magnetic fields;
   the second device including two transmitting loop antennas that are non-parallel relative to each other and an RF signal generator generating the RF signal for transmission of the RF signal to the transmitting loop antennas; and
   the processor determining direction from the first device to the second device based on a gradient of magnetic field emitted by the loop antennas of the second device.

2. The system of claim 1, wherein the RF signal is fed alternately to the loop antennas in specified time intervals, and wherein the direction to the second device from the first device is determined based on a difference of the EMF excited in the EMF sensors by the two loop antennas of the second device.

3. The system of claim 1, further comprising a third loop antenna in each of the first and second devices, whose plane is located at angles to planes of the two loop antennas of its device, and intersects with a plane-plane intersection line of the two loop antennas of its device.

4. The system of claim 1, wherein the two loop antennas of the first device are orthogonal and have their axes horizontal relative to the ground, and the two loop antennas of the second device are orthogonal and have their axes horizontal relative to the ground.

5. The system of claim 1, wherein the second device is configured to transmit the RF signal generated by the RF signal generator to the loop antennas of the second device at predetermined intervals.

6. The system of claim 1, wherein each of the loop antennas is a double loop antenna with two EMF sensors, and the direction to the second device from the first device is determined based on a comparison of EMFs generated in the same double loop antenna, wherein the double loop antenna includes two adjacent loops connected in series, each of the two adjacent loops having its own axis.

7. The system of claim 6, wherein the direction to the second device from the first device is determined based on where the EMF is larger in a part of the double loop antenna that is closer to the second device, when a difference between induced EMFs exceed a predetermined threshold.

8. The system of claim 4, wherein the processor calculates the orientation of the second device in relation to the first device following determination of the orientation of a direction axis and distance to the second device and a determination of amplitudes and orientations of strengths of the magnetic field generated by the loop antennas of the second device.

9. The system of claim 1, wherein the first device includes a displacement sensor, and the direction to the second device from the first device is determined with a moving device body, when the EMF induced in the loop antenna increases and a distance to the second device is reduced, and vice versa.

10. The system of claim 9, wherein the displacement sensor is an inertial navigation system.

11. The system of claim 9, wherein the displacement sensor is an odometer.

12. The system of claim 11, wherein intervals between rotational changes are specified according to a maximum possible rotational speed of the first device and a maximum possible rotational speed of the second device so that a maximum angle between direction axes of two successive measurements does not exceed 90°.

13. The system of claim 8, wherein when the first device stops, a constant EMF signal generated in the loop antennas of the first device by the second device is received, and then when the first device moves, a change of the EMF generated in the loop antenna is detected, and the direction to the second device from the first device is determined.

14. The system of claim 9, wherein the direction to the second device from the first device is determined when the second device is moving uniformly or stops.

15. The system of claim 1, further comprising a separate remote unit that calculates the orientation of the second device relative to the first device, the remote unit including a processor that is the same type of processor as the processor of the first device, and
wherein the remote unit receives motion parameters of the first device and of the second device and selects motion directions of the first device and the second device from four alternatives:
(i) the first device moving towards the second device, the second device moving away from the first device;
(ii) the first device moves towards the second device, the second device moves towards the first device;
(iii) the first device moves away from the second device, the second device moves away from the first device; and
(iv) the first device moves away from the second device, the second device moves towards the first device.

16. The system of claim 15, wherein the separate remote unit is a processor of a mobile phone.

17. The system of claim 16, wherein the mobile phone shows a dynamic schematic display of motion parameters of the first device and of the second device.

18. The system of claim 15, wherein the separate remote unit calculates the first device's direction vectors to several second devices.

* * * * *